(12) United States Patent
Zhao et al.

(10) Patent No.: US 12,034,013 B2
(45) Date of Patent: Jul. 9, 2024

(54) ARRAY SUBSTRATE, DISPLAY PANEL, AND ELECTRONIC DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Chongyang Zhao, Beijing (CN); Yingmeng Miao, Beijing (CN); Zhihua Sun, Beijing (CN); Feng Qu, Beijing (CN); Xiaochun Xu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 263 days.

(21) Appl. No.: 17/594,832

(22) PCT Filed: Dec. 21, 2020

(86) PCT No.: PCT/CN2020/137928
§ 371 (c)(1),
(2) Date: Oct. 29, 2021

(87) PCT Pub. No.: WO2022/133638
PCT Pub. Date: Jun. 30, 2022

(65) Prior Publication Data
US 2022/0399377 A1    Dec. 15, 2022

(51) Int. Cl.
*H01L 27/12* (2006.01)
*G02F 1/1362* (2006.01)
*G02F 1/1368* (2006.01)

(52) U.S. Cl.
CPC .... *H01L 27/1244* (2013.01); *G02F 1/136286* (2013.01); *G02F 1/13625* (2021.01);
(Continued)

(58) Field of Classification Search
CPC ..... G03F 9/00; H01L 27/124; H01L 27/1288; H01L 27/1244; G02F 1/136254;
(Continued)

(56) References Cited

U.S. PATENT DOCUMENTS 7,714,958 B2    5/2010  Hosoya
8,115,938 B2    2/2012  Van Haren
(Continued)

FOREIGN PATENT DOCUMENTS

CN        1967335 A       5/2007
CN      101526757 A       9/2009
(Continued)

OTHER PUBLICATIONS

International Search Report and Written Opinion dated Sep. 29, 2021, for corresponding PCT Application No. PCT/CN2020/137928.
(Continued)

*Primary Examiner* — Mariam Qureshi
(74) *Attorney, Agent, or Firm* — Kinney & Lange, P.A.

(57) ABSTRACT

An array substrate, a display panel, and an electronic device are provided. The array substrate includes: a base substrate; a first electrode arranged on the base substrate; a gate line arranged on the base substrate, wherein the gate line is electrically insulated from the first electrode; a second electrode arranged on a side of the gate line away from the base substrate, wherein at least one first sub-pixel unit provided on the base substrate includes: a first connection portion arranged in a same layer as the second electrode and a second connection portion arranged in a same layer as the gate line, wherein the second connection portion is electrically connected to the first electrode, and an orthographic projection of the second connection portion on the base
(Continued)

substrate at least partially overlaps an orthographic projection of the first connection portion on the base substrate.

16 Claims, 10 Drawing Sheets

(52) U.S. Cl.
CPC ...... *G02F 1/136295* (2021.01); *G02F 1/1368* (2013.01); *H01L 27/1288* (2013.01)

(58) Field of Classification Search
CPC ............. G02F 1/134309; G02F 1/1368; G02F 1/13625; G02F 1/136286
See application file for complete search history.

(56) References Cited

U.S. PATENT DOCUMENTS

| | | | |
|---|---|---|---|
| 10,134,803 | B2 | 11/2018 | Chaji et al. |
| 10,459,278 | B2 | 10/2019 | Kim et al. |
| 10,720,486 | B2 | 7/2020 | Lhee et al. |
| 10,763,247 | B2 | 9/2020 | Han et al. |
| 11,264,372 | B2 | 3/2022 | Han et al. |
| 2003/0003677 | A1 | 1/2003 | Fukada |
| 2003/0146475 | A1 | 8/2003 | Lai |
| 2005/0225708 | A1* | 10/2005 | Oke ................... G09G 3/3607 349/139 |
| 2007/0109470 | A1 | 5/2007 | Hosoya |
| 2008/0211974 | A1* | 9/2008 | Ikebe ................ G02F 1/134363 349/5 |
| 2009/0225331 | A1 | 9/2009 | Van Haren |
| 2012/0094416 | A1 | 4/2012 | Tanaka et al. |
| 2012/0149139 | A1 | 6/2012 | Tanaka et al. |
| 2015/0185513 | A1* | 7/2015 | Wu ....................... G02F 1/1309 438/4 |
| 2015/0187307 | A1 | 7/2015 | Jin et al. |
| 2016/0218143 | A1 | 7/2016 | Chaji et al. |
| 2018/0188595 | A1 | 7/2018 | Kim et al. |
| 2018/0358404 | A1 | 12/2018 | Chaji et al. |
| 2019/0229175 | A1 | 7/2019 | Lhee et al. |
| 2019/0326267 | A1* | 10/2019 | Han ..................... G09G 3/2092 |
| 2020/0350393 | A1 | 11/2020 | Lhee et al. |
| 2020/0388602 | A1 | 12/2020 | Han et al. |
| 2021/0202572 | A1 | 7/2021 | Chaji et al. |

FOREIGN PATENT DOCUMENTS

| | | |
|---|---|---|
| CN | 101661220 A | 3/2010 |
| CN | 101900933 A | 12/2010 |
| CN | 102402090 A | 4/2012 |
| CN | 103887217 A | 6/2014 |
| CN | 103941503 A | 7/2014 |
| CN | 106502060 A | 3/2017 |
| CN | 106601634 A | 4/2017 |
| CN | 108198835 A | 6/2018 |
| CN | 108254955 A | 7/2018 |
| CN | 109075119 A | 12/2018 |
| CN | 109445646 A | 3/2019 |
| CN | 110085629 A | 8/2019 |
| CN | 110148607 A | 8/2019 |
| CN | 110571234 A | 12/2019 |
| CN | 111293135 A | 6/2020 |
| CN | 111684576 A | 9/2020 |
| CN | 111965908 A | 11/2020 |
| CN | 112041990 A | 12/2020 |
| IN | 103969873 A | 8/2014 |

OTHER PUBLICATIONS

Extended European Search Report dated Jul. 24, 0223, for corresponding European Application No. 20966219.6.

* cited by examiner

A-A'

B-B'

C-C'

ARRAY SUBSTRATE, DISPLAY PANEL, AND ELECTRONIC DEVICE

CROSS REFERENCE TO RELATED APPLICATION(S)

This application is a Section 371 National Stage Application of International Application No. PCT/CN2020/137928, filed on Dec. 21, 2020, entitled "ARRAY SUBSTRATE, DISPLAY PANEL, AND ELECTRONIC DEVICE", which is incorporated herein by reference.

TECHNICAL FIELD

The present disclosure relates to a field of a display technology, and in particular to an array substrate, a display panel, and an electronic device.

BACKGROUND

With continuous development of display technologies, liquid crystal display products have occupied a leading position in display industries. In recent years, a demand for a liquid crystal display panel with a large display size is increasing. This makes a size of a display panel far exceed a size of a mask used in an exposure process. Therefore, it is necessary to use multiple masks for splicing exposure when manufacturing an array substrate in the display panel. The splicing exposure requires a connection portion to detect whether an offset during a splicing process is qualified or not. Currently, the connection portion is only provided in a surrounding area of the display panel.

SUMMARY

The embodiments of the present disclosure provide an array substrate, including:
  a base substrate;
  a first electrode arranged on the base substrate;
  a gate line arranged on the base substrate, wherein the gate line is electrically insulated from the first electrode;
  a second electrode arranged on a side of the gate line away from the base substrate, wherein at least one sub-pixel unit including at least one first sub-pixel unit is provided on the base substrate, and the at least one first sub-pixel unit includes:
  a first connection portion arranged in a same layer as the second electrode and a second connection portion arranged in a same layer as the gate line, wherein the second connection portion is electrically connected to the first electrode, and an orthographic projection of the second connection portion on the base substrate at least partially overlaps an orthographic projection of the first connection portion on the base substrate.

In some embodiments, the first connection portion and the second connection portion are located on a side of the first electrode away from the base substrate.

In some embodiments, the first connection portion is electrically connected to the second connection portion through a via hole.

In some embodiments, the array substrate further includes an insulating layer located between the gate line and the second electrode, wherein the first sub-pixel unit further includes a third connection portion formed as an opening of the via hole in the insulating layer between the gate line and the second electrode.

In some embodiments, an orthographic projection of the third connection portion on the base substrate at least partially overlaps the orthographic projection of the first connection portion on the base substrate.

In some embodiments, the orthographic projection of the second connection portion on the base substrate at least partially overlaps an orthographic projection of the first electrode on the base substrate, the second connection portion has a first edge and a second edge, the first electrode has a third edge and a fourth edge located in the first sub-pixel unit, the first edge and the third edge are parallel to each other, and the second edge and the fourth edge are parallel to each other.

In some embodiments, the array substrate further includes:
  a source and drain layer located on a side of the gate line away from the base substrate and located on a side of the second electrode facing the base substrate; and
  a data line arranged in a same layer as the source and drain layer, wherein the data line extends in a first direction.

In some embodiments, the first sub-pixel unit further includes a fourth connection portion arranged in the same layer as the gate line and a fifth connection portion arranged in the same layer as the source and drain layer;
  wherein an orthographic projection of the fifth connection portion on the base substrate at least partially overlaps an orthographic projection of the fourth connection portion on the base substrate.

In some embodiments, each of the orthographic projection of the fifth connection portion on the base substrate and the orthographic projection of the fourth connection portion on the base substrate does not overlap the orthographic projection of the first connection portion on the base substrate and the orthographic projection of the second connection portion on the base substrate.

In some embodiments, the first sub-pixel unit includes a sixth connection portion arranged in a same layer as the first electrode, and an orthographic projection of the sixth connection portion on the base substrate falls within an orthographic projection of the gate line on the base substrate.

In some embodiments, the array substrate further includes an active layer located on a side of the gate line away from the base substrate and located on a side of the second electrode facing the base substrate, wherein the at least one sub-pixel unit further includes at least one second sub-pixel unit including a seventh connection portion arranged in the same layer as the gate line and an eighth connection portion arranged in the same layer as the active layer, and an orthographic projection of the seventh connection portion on the base substrate at least partially overlaps an orthographic projection of the eighth connection portion on the base substrate.

In some embodiments, the first sub-pixel unit and the second sub-pixel unit are blue sub-pixel units.

In some embodiments, the array substrate further includes a data line extending in a first direction, wherein a plurality of first sub-pixel units and a plurality of second sub-pixel units are provided on the base substrate and are alternately distributed on the array substrate in a second direction intersecting the first direction.

In some embodiments, the first sub-pixel unit includes a sixth connection portion arranged in the same layer as the first electrode, and an orthographic projection of the sixth connection portion on the base substrate falls within the orthographic projection of the gate line on the base substrate.

In some embodiments, the data line is provided with a data line widening portion having a width greater than a width of a part of the data line adjacent to the data line widening portion, and a source and drain layer repeated exposure area passes through the data line widening portion.

In some embodiments, an orthographic projection of an edge of the data line widening portion on the base substrate has a concave shape toward a center of the data line.

In some embodiments, the array substrate further includes a gate portion in the gate line and a first electrode bridge line arranged in the same layer as the gate line, wherein the first electrode bridge line and the gate line extend in a second direction intersecting the first direction, the first electrode bridge line is configured to electrically connect the first electrodes in adjacent sub-pixels in the second direction, and an orthographic projection of the data line widening portion on the base substrate is located between the orthographic projection of the gate line on the base substrate and an orthographic projection of the first electrode bridge line on the base substrate.

In some embodiments, the array substrate further includes: a first electrode transfer line arranged in a same layer as the second electrode, wherein the first electrode transfer line extends in the first direction and configured to electrically connect the first electrodes in adjacent sub-pixel units in the first direction, the first electrode transfer line is provided with a transfer line widening portion having a width greater than a width of a part of the first electrode transfer line adjacent to the transfer line widening portion, a second electrode repeated exposure area passes through the transfer line widening portion.

In some embodiments, an orthographic projection of an edge of the transfer line widening portion on the base substrate has a concave shape toward a center of the first electrode transfer line.

In some embodiments, the first electrode is a common electrode, and the second electrode is a pixel electrode.

The embodiments of the present disclosure further provide a display panel, including:
- the array substrate according to any one of the embodiments described above;
- an opposite substrate located on a side of the array substrate away from the base substrate; and
- a liquid crystal layer located between the array substrate and the opposite substrate.

The embodiments of the present disclosure further provide an electronic device, including:
- the array substrate or the display panel according to any one of the embodiments described above.

BRIEF DESCRIPTION OF THE DRAWINGS

In order to more clearly explain the technical solutions in the embodiments of the present disclosure, the accompanying drawings of the embodiments will be briefly introduced below. It should be noted that the accompanying drawings in the following description are only some embodiments of the present disclosure, and are not intended to limit the present disclosure.

DETAILED DESCRIPTION OF EMBODIMENTS

In order to make objectives, technical solutions and advantages of the present disclosure more apparent, the embodiments of the present disclosure will be described below with reference to the accompanying drawings. It should be understood that the following description of the embodiments is intended to explain and illustrate a general idea of the present disclosure, and should not be construed as limiting the present disclosure. In the description and the accompanying drawings, the same or similar reference signs indicate the same or similar components or members. For clarity, the accompanying drawings are not necessarily drawn to scale, and some known components and structures may be omitted in the accompanying drawings.

Unless otherwise defined, technical terms or scientific terms used in the present disclosure shall be of the general meaning understood by those of ordinary skilled in the art. The terms "first," "second," and the like used in the present disclosure do not indicate any order, quantity or importance, but are used to distinguish different components. The term "a", "an" or "one" does not exclude multiple. The terms "comprising," "including" and the like indicate that the element or item preceding the term includes the elements or items listed following the term as well as the equivalents, and do not exclude other elements or items. The terms "connected," "coupled," or the like are not limited to physical or mechanical connections, but may include electrical connections, whether direct or indirect. The terms "upper", "lower", "left", "right", "top" or "bottom" and the like are only used to indicate relative positional relationship, and when the absolute position of the object described is changed, the relative positional relationship may also correspondingly changed. When an element such as a layer, a film, an area or a base substrate is referred to be located "above" or "below" another element, the element may be "directly" located "above" or "below" the other element, or there may be an intermediate element.

Figure 1A:
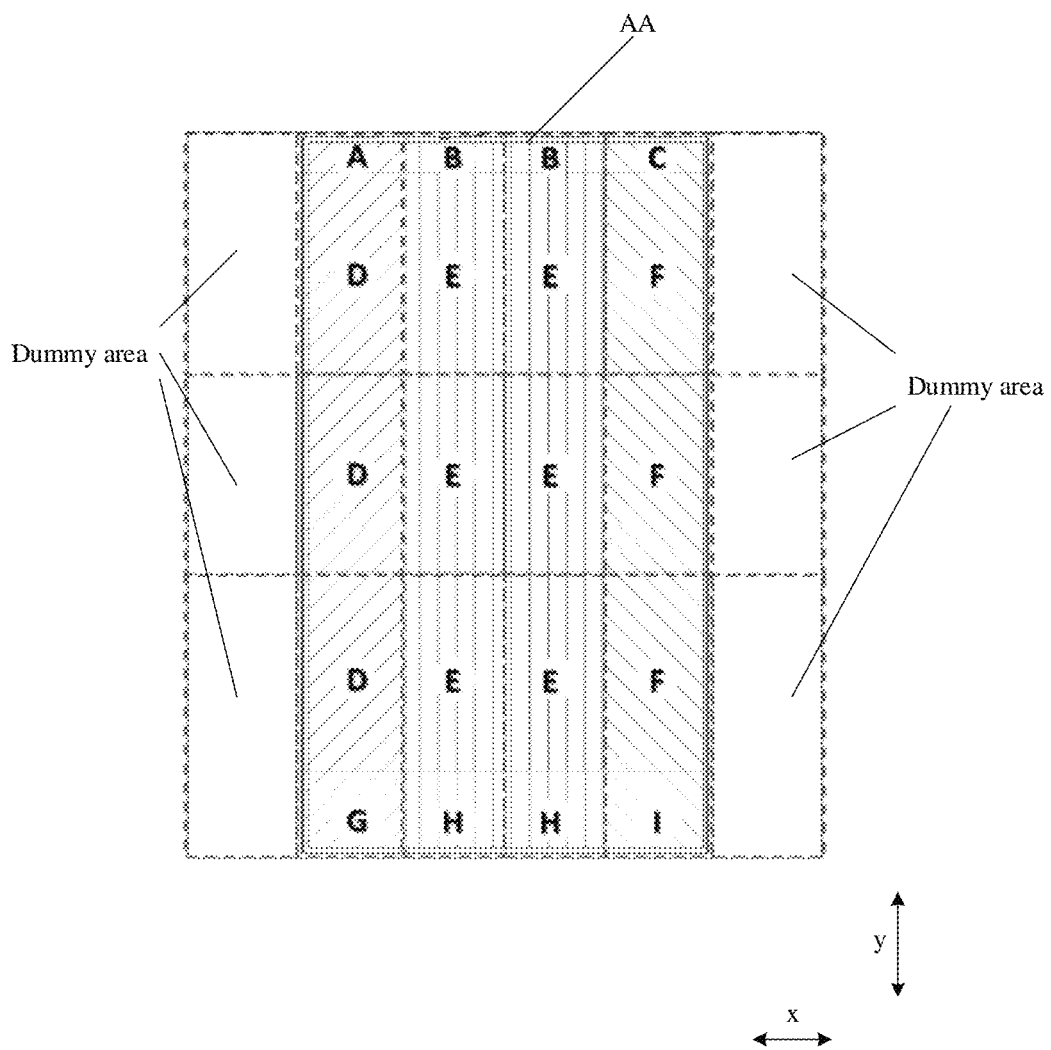
FIG. 1A shows a schematic diagram of a large-size display panel manufactured by splicing exposure.
Figure 1B:
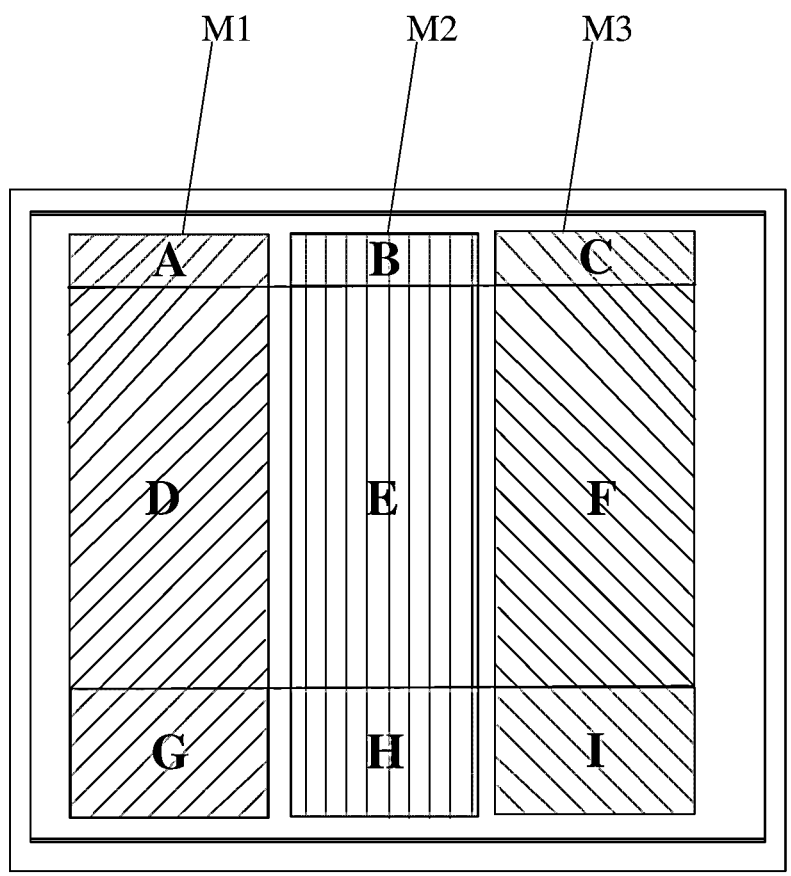
FIG. 1B shows a schematic diagram of a mask corresponding to FIG. 1A.

In a process of manufacturing a large-size display panel (especially a display panel with an ultra-large size (98 inches or more)), since a mask used for exposure generally has a size significantly less than that of the display panel, it is necessary to use a plurality of masks for splicing exposure in manufacturing an array substrate. FIG. 1A and FIG. 1B show examples of splicing exposure for a large-size display panel. FIG. 1A shows a schematic plan view of a normal display area AA of a whole large-size display panel. In FIG. 1A, the display area AA is divided into twelve exposure patterns arranged in three rows and four columns, which are separated by dotted lines in FIG. 1A. A corresponding mask assembly is shown in FIG. 1B. The mask assembly includes three masks M1, M2 and M3 arranged in parallel. Taking the mask M1 as an example, the mask includes three regions, including A region, D region and G region. With a combination of the three regions, three patterns including a pattern of the A region+the D region, a pattern of the D region, and a pattern of the D region+the G region may be exposed on the array substrate. The three types of patterns may be used to form three patterns in a leftmost column in the display area AA in FIG. 1A. Similarly, a pattern of B region+E region, a pattern of E region, and a pattern of E region+H region in the mask M2 may be used to form three patterns in a second column from the left of the display area AA and three patterns in a third column from the left of the display area AA in FIG. 1A; a pattern of C region+F region, a pattern of F region, and a pattern of F region+I region in the mask M3 may be used to form three patterns in a rightmost column in the display area AA in FIG. 1A. In this way, the twelve exposure patterns are spliced into a complete display area AA. In addition to the display area AA, FIG. 1A further shows three dummy areas on a left side and three dummy areas on a right side. These dummy areas are formed to prevent a generation of static electricity during a production process.

It should be understood that in the process of manufacturing the array substrate, a plurality of film layers may be sequentially formed on the base substrate. In order to ensure an accuracy of the process, it is necessary to monitor a positioning error of a pattern of each film layer, which may be achieved by providing an alignment mark (or referred to as a connection portion) for the pattern of each film layer. For example, it is necessary to monitor a position of the pattern of each film layer on the base substrate so as to detect whether the pattern of the film layer has an offset (also called an absolute offset) with respect to the base substrate (such as a glass substrate or a plastic substrate) or not. An alignment mark used to monitor the absolute offset may be referred to as an absolute offset alignment mark. Further, a relative position between the patterns of different film layers may be monitored so as to detect whether there is a relative offset between the film layers. An alignment mark used to monitor the relative offset may also be referred to as an overlapping alignment mark. These alignment marks may be used in pairs, that is, alignment marks that may be matched and used are provided on the array substrate and a corresponding position of the mask assembly so as to achieve an alignment of the mask and the array substrate.

In a related art, the alignment mark (or referred to as a connection portion) on the mask assembly may only be provided at a position around the mask, otherwise the alignment mark may fall into the display area AA, and thus affect a normal display of the product. However, when manufacturing a large-size panel on which the splicing exposure needs to be performed in two directions (such as x-direction and y-direction) as shown in FIG. 1A, it was found that all sides of an exposure pattern that falls into a middle part of the display area AA (for example, the exposure patterns (marked with E) in the middle of a second column and a third column from the left in the display area AA in FIG. 1A) fall into the display area AA, so that a requirement for providing the alignment mark around the display area may not be satisfied. If these exposure patterns are provided with alignment marks on the array substrate, there may be a problem that a splicing offset of the exposure patterns may not be monitored. Splicing offset or misalignment may cause defects such as dark line or bright line (for example, due to a change in a resistance of a gate line), or abnormal display (for example, due to a short circuit or open circuit in a data line) of a final display panel.

In the embodiments of the present disclosure, the alignment mark is provided in a sub-pixel unit of the display area AA of the display panel, so that a part of the display area AA may be used for the alignment of the exposure patterns. This may solve the above-mentioned problem that the alignment offset of a splicing region may not be monitored when splicing and exposing some of the exposure patterns described above. It should be noted that although the present disclosure aims to monitor the alignment of the splicing exposure by providing the alignment mark in the sub-pixel unit, it does not mean that in the embodiments of the present disclosure, there is no need to provide the alignment mark around the display area AA. If necessary, the alignment mark may still be arranged around the display area AA, or no alignment mark can be arranged around the display area AA.

Figure 2A:
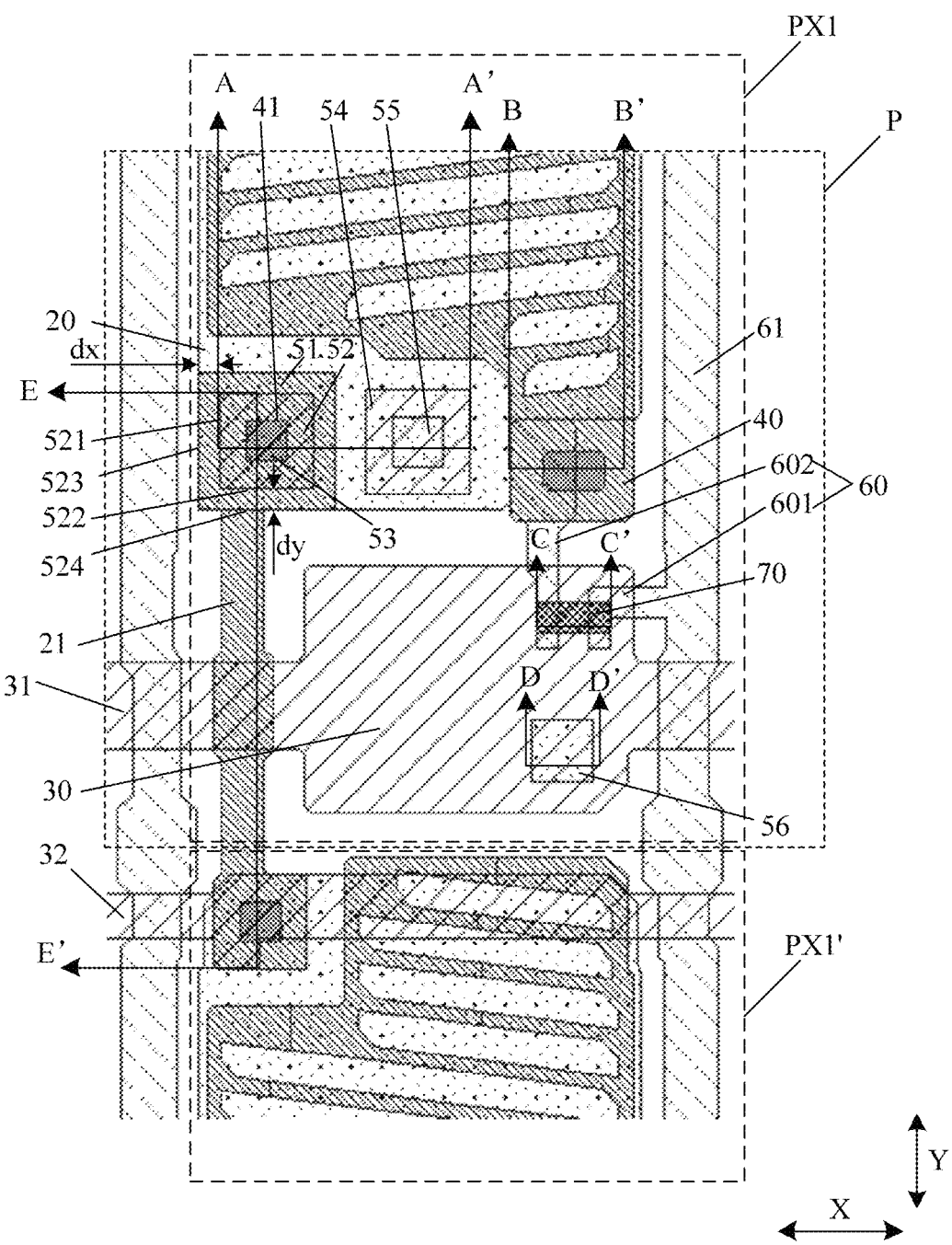
FIG. 2A shows a schematic plan view of a first sub-pixel unit on the array substrate according to some embodiments of the present disclosure.
Figure 3:
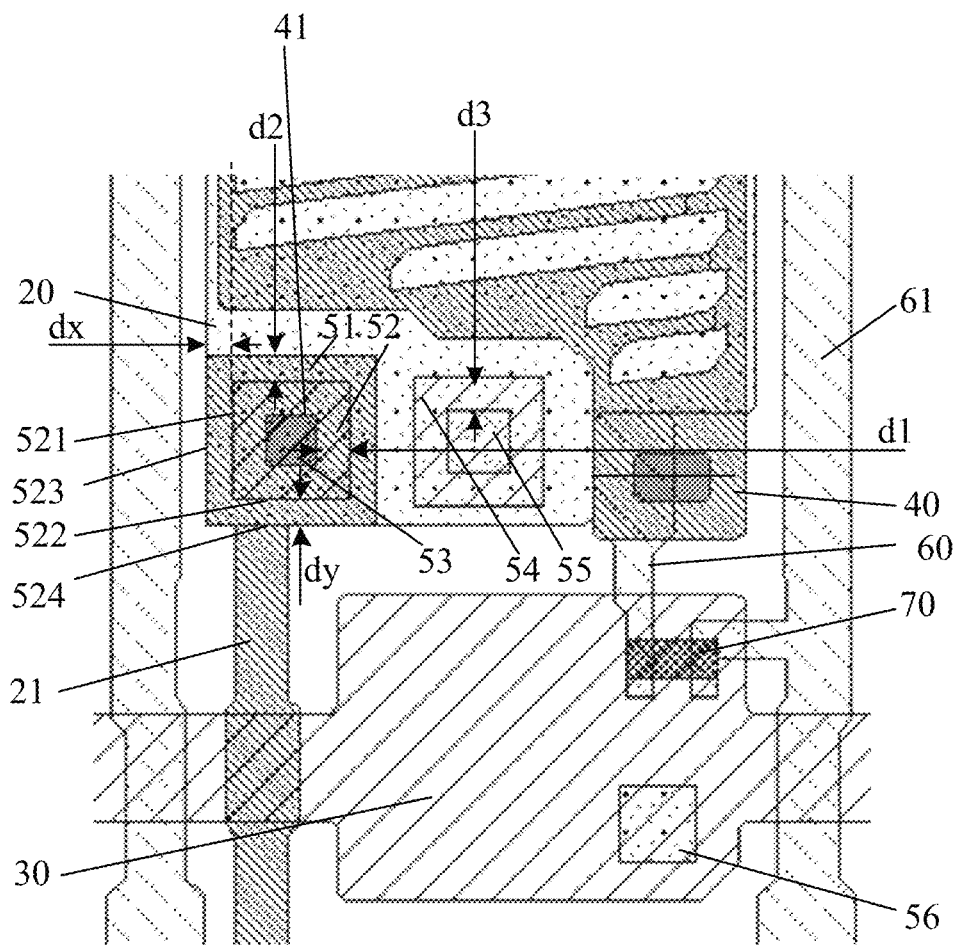
FIG. 3 schematically shows an enlarged view of part P in FIG. 2A.

The embodiments of the present disclosure provide an array substrate. The array substrate may include a base substrate 10 and a plurality of sub-pixel units arranged on the base substrate 10. As described above, the alignment mark is embedded in the sub-pixel unit. FIG. 2A shows an example of a sub-pixel unit including an alignment mark, and the sub-pixel unit is hereinafter referred to as a first sub-pixel unit PX1. FIG. 3 shows an enlarged view of part P in FIG. 2A. FIG. 4 to FIG. 8 show cross-sectional views taken along line A-A', line B-B', line C-C', line D-D' and line E-E' in FIG. 2A, respectively.

As an example, the array substrate may include: a first electrode (for example, a common electrode) 20, a gate line 30, and a second electrode (for example, a pixel electrode) 40. The first electrode 20 is arranged on the base substrate 10. The gate line 30 is arrange on the base substrate 10 and is electrically insulated from the first electrode 20. The second electrode 40 is arranged on a side of the gate line 30 away from the base substrate 10. At least one (for example, a plurality of) sub-pixel units on the base substrate may include the first sub-pixel unit PX1. The first sub-pixel unit PX1 may include a first connection portion 51 and a second connection portion 52. The first connection portion 51 is arranged in a same layer as the second electrode 40, and the second connection portion 52 is arranged in a same layer as the gate line 30. An orthographic projection of the second connection portion 52 on the base substrate 10 at least partially overlaps an orthographic projection of the first connection portion 51 on the base substrate 10. For example, the orthographic projection of the second connection portion 52 on the base substrate 10 may fall within the orthographic projection of the first connection portion 51 on the base substrate 10. Alternatively, the orthographic projection of the first connection portion 51 on the base substrate 10 may fall within the orthographic projection of the second connection portion 52 on the base substrate 10. The first connection portion 51 and the second connection portion 52 are used to align a pattern in the second electrode 40 with a pattern in the gate line 30. The first connection portion 51 and the second connection portion 52 may be regarded as an overlapping alignment mark of the pattern in the second electrode 40 and the pattern in the gate line 30, and are used to detect a relative positioning error of the pattern in the second electrode 40 and the pattern in the gate line 30. For example, the first connection portion 51 may also be used as an absolute offset alignment mark of the pattern in the second electrode 40 so as to detect an offset of the pattern in the second electrode 40 with respect to the base substrate 10. Similarly, the second connection portion 52 may also be used as an absolute offset alignment mark of the pattern in the gate line 30 so as to detect an offset of the pattern in the gate line 30 with respect to the base substrate 10. In some embodiments, one or more first sub-pixel units PX1 may be provided on the array substrate.

In some embodiments, the first connection portion 51 and the second connection portion 52 are located on a side of the first electrode 20 away from the base substrate 10.

Figure 4:
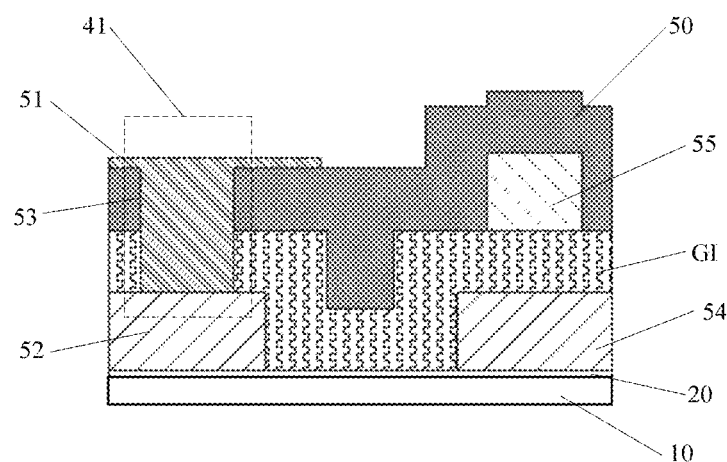
FIG. 4 schematically shows a schematic diagram taken along section line A-A' in FIG. 2A.

In some embodiments, the second connection portion 52 is electrically connected to the first electrode 20. For example, the array substrate may be further provided with a via hole 41 that is electrically connected to the first connection portion 51 from the first electrode 20 through the second connection portion 52, and the second connection portion 52 is electrically connected to the first electrode 20 and the first connection portion 51. It should be noted that in this embodiment, the first connection portion 51 and the second connection portion 52 are not separately provided, and are embedded in a functional structure of the first sub-pixel unit PX1. As shown in FIG. 2A, in order to maintain a stability of a common electrode signal, a part of the first electrode 20 in the first sub-pixel unit PX1 and a part of the first electrode 20 in an another sub-pixel unit PX1' adjacent to the first sub-pixel unit PX1 are bridged together through a first electrode transfer line 21 arranged in the same layer as the second electrode 40. The first electrode transfer line 21 may be electrically connected to the first electrode 20 through the via hole 41. As shown in FIG. 2A and FIG. 4, the first connection portion 51 and the second connection portion 52 are integrated with the via hole 41. The first connection portion 51 may also be regarded as a part of the first electrode transfer line 21. This design may prevent the first connection portion 51 and the second connection portion 52 from additionally occupying an area of the array substrate, thereby saving the area of the array substrate.

In some embodiments, the array substrate may further include an insulating layer 50 located between the gate line 30 and the second electrode 40. The first sub-pixel unit PX1 may further include a third connection portion 53. The third connection portion 53 may be an opening of the via hole 41 in the insulating layer 50 between the gate line 30 and the second electrode 40, and the third connection portion 53 is used to align a pattern in the insulating layer 50 and the pattern in the gate line 30 with respect to the second connection portion 52. For example, an orthographic projection of the third connection portion 53 on the base substrate 10 at least partially overlaps the orthographic projection of the first connection portion 51 on the base substrate 10. For example, the orthographic projection of the third connection portion 53 on the base substrate 10 may fall within the orthographic projection of the first connection portion 51 on the base substrate 10. The first connection portion 51, the second connection portion 52 and the third connection portion 53 are integrated and multiplexed with the via hole 41 so as to save a wiring space.

In some embodiments, the first connection portion 51, the second connection portion 52 and the third connection portion 53 are rectangles with a common geometric center. The pattern of the second electrode 40, the pattern of the gate line 30 and the pattern of the insulating layer 50 may be aligned with each other by overlapping the centers of the first connection portion 51, the second connection portion 52 and the third connection portion 53. In some embodiments, as shown in FIG. 3, a distance d2 between an edge of the first connection portion 51 and an adjacent edge of the second connection portion 52 is about 3.5 microns, and a distance d3 between an edge of the second connection portion 52 and an adjacent edge of the third connection portion 53 is about 3.5 microns. The specific forms of the first connection portion 51, the second connection portion 52 and the third connection portion 53 are not limited to this. For example, they may be designed in various desired shapes such as a circle or a hexagon.

In some embodiments, the orthographic projection of the second connection portion 52 on the base substrate 10 at least partially overlaps the orthographic projection of the first electrode 20 on the base substrate 10. The second connection portion 52 has a first edge 521 and a second edge 522. The first electrode 20 has a third edge 523 and a fourth edge 524 located in the first sub-pixel unit PX1. The first edge 521 and the third edge 523 are arranged parallel to each other, and are used to align the pattern in the gate line 30 with respect to the pattern in the first electrode 20 in a first direction (for example, Y-direction in FIG. 2A). The second edge 522 and the fourth edge 524 are arranged parallel to each other, and are used to align the pattern in the gate line 30 with respect to the pattern in the first electrode 20 in a second direction (for example, X-direction in FIG. 2A) intersecting the first direction. For example, the first direction and the second direction are perpendicular to each other. The first edge 521 and the third edge 523 as well as the second edge 522 and the fourth edge 524 are used to align the pattern in the gate line 30 with the pattern in the first electrode 20 in the first direction and the second direction, respectively, and may be regarded as the overlapping alignment mark of the first electrode 20 and the gate line 30. For example, as shown in FIG. 2A, an error of a distance dx between the first edge 521 and the third edge 523 may be used to indicate an alignment error of the pattern in the gate line 30 and the pattern in the first electrode 20 in the first direction, and an error of a distance dy between the second edge 522 and the fourth edge 524 may be used to indicate an alignment error of the pattern in the gate line 30 and the pattern in the first electrode 20 in the second direction. Therefore, the overlapping alignment mark of the first electrode 20 and the gate line 30 may also be integrated with the via hole structure 41 described above, so as to avoid additionally occupying the wiring space. As an example, the distance between the first edge 521 and the third edge 523 may be about 2.5 microns, and the distance between the second edge 522 and the fourth edge 524 may also be about 2.5 microns.

In some embodiments, the array substrate may further include a source and drain layer 60. The source and drain layer 60 is located on the side of the gate line 30 away from the base substrate 10 and located on a side of the second electrode 40 facing the base substrate 10. The first sub-pixel unit PX1 may further include a fourth connection portion 54 arranged in the same layer as the gate line 30 and a fifth connection portion 55 arranged in the same layer as the source and drain layer 60. The fourth connection portion 54 and the fifth connection portion 55 are used to align a pattern in the source and drain layer 60 with the pattern in the gate line 30. An orthographic projection of the fifth connection portion 55 on the base substrate 10 at least partially overlaps an orthographic projection of the fourth connection portion 54 on the base substrate 10. For example, the orthographic projection of the fifth connection portion 55 on the base substrate 10 may fall within the orthographic projection of the fourth connection portion 54 on the base substrate 10. The fourth connection portion 54 and the fifth connection portion 55 may be regarded as the overlapping alignment mark of the pattern in the source and drain layer 60 and the pattern in the gate line 30, and are used to detect a relative positioning error of the pattern in the source and drain layer 60 and the pattern in the gate line 30. As an example, the fourth connection portion 55 may be further used as an absolute offset alignment mark of the pattern in the source and drain layer 60 so as to detect an offset of the pattern in the source and drain layer 60 with respect to the base substrate 10.

In some embodiments, each of the orthographic projection of the fifth connection portion 55 on the base substrate 10 and the orthographic projection of the fourth connection portion 54 on the base substrate 10 does not overlap the orthographic projection of the first connection portion 51 on the base substrate and the orthographic projection of the second connection portion 52 on the base substrate.

As an example, the fourth connection portion 54 and the fifth connection portion 55 are rectangles with a common geometric center. In this way, the pattern of the source and drain layer 60 and the pattern of the gate line 30 may be aligned with each other by overlapping the centers of the two connection portions. In some embodiments, as shown in FIG. 3, the fifth connection portion 55 may have a length of about 8 microns and a width of about 8 microns, and a distance d3 between an edge of the fourth connection portion 54 and an adjacent edge of the fifth connection portion 55 is about 3.5 microns. However, the specific forms of the fourth connection portion 54 and the fifth connection portion 55 are not limited to this. For example, they may be designed in various desired shapes such as a circle or a hexagon.

In some embodiments, the first sub-pixel unit PX1 may include a sixth connection portion 56 arranged in the same layer as the first electrode 20. The sixth connection portion 56 is used to align the pattern in the first electrode 20 with the base substrate 10, and an orthographic projection of the sixth connection portion 56 on the base substrate 10 falls within the orthographic projection of the gate line 30 on the base substrate 10. The sixth connection portion 56 is used as an absolute offset alignment mark of the first electrode 20 so as to detect an offset of the pattern in the first electrode 20 with respect to the base substrate 10.

In some embodiments, the array substrate may further include an active layer 70 located on the side of the gate line 30 away from the base substrate 10 and located on the side of the second electrode 40 facing the base substrate 10. For example, the active layer 70 may be located on the side of the source and drain layer 60 facing the base substrate 10. In some embodiments, an orthographic projection of the sixth connection portion 56 on the base substrate 10 may not overlap the orthographic projection of the source and drain layer 60 on the base substrate 10 and the orthographic projection of the active layer 70 on the base substrate 10.

Figure 2B:
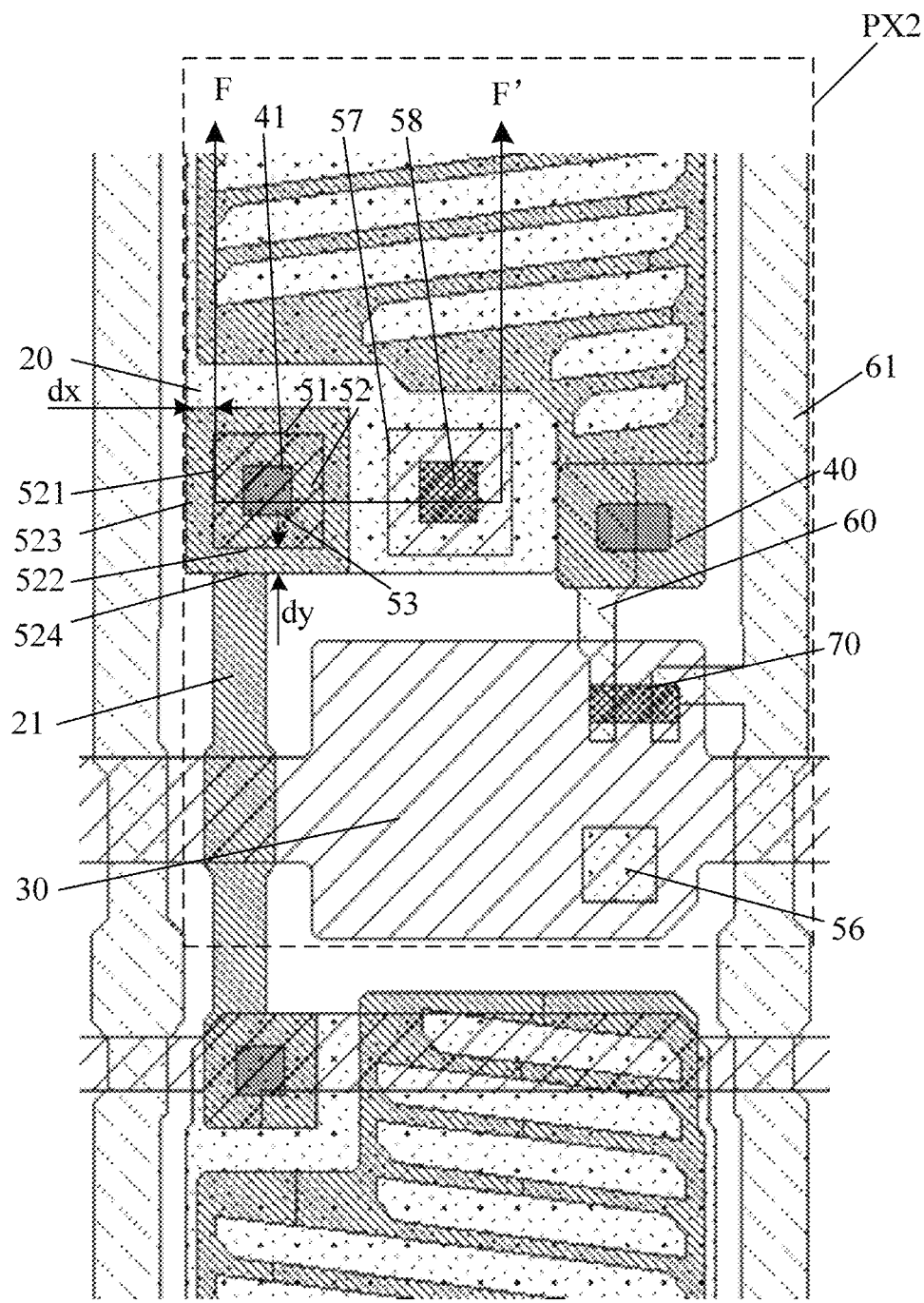
FIG. 2B shows a schematic plan view of a second sub-pixel unit on the array substrate according to some embodiments of the present disclosure.
Figure 9:
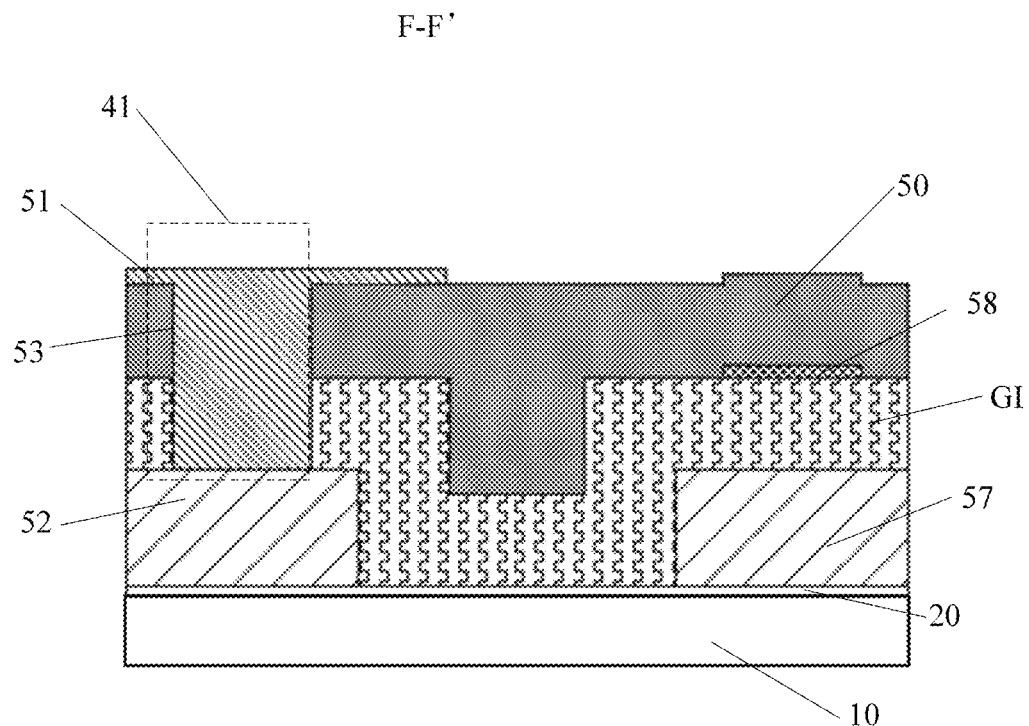
FIG. 9 schematically shows a schematic diagram taken along section line F-F' in FIG. 2B.

The plurality of sub-pixel units may further include a second sub-pixel unit PX2. As shown in FIG. 2B and FIG. 9, the second sub-pixel unit PX2 may include a seventh connection portion 57 arranged in the same layer as the gate line 30 and an eighth connection portion 58 arranged in the same layer as the active layer 70. The seventh connection portion 57 and the eighth connection portion 58 are used to align the pattern in the active layer 70 with the pattern in the gate line 30. An orthographic projection of the seventh connection portion 57 on the base substrate 10 at least partially overlaps an orthographic projection of the eighth connection portion 58 on the base substrate 10. For example, the orthographic projection of the eighth connection portion 58 on the base substrate 10 may fall within the orthographic projection of the seventh connection portion 57 on the base substrate 10. The seventh connection portion 57 and the eighth connection portion 58 may be regarded as the overlapping alignment mark of the pattern in the active layer 70 and the pattern in the gate line 30, so as to detect a relative positioning error of the pattern in the active layer 70 and the pattern in the gate line 30. As an example, the eighth connection portion 58 may be further used as an absolute offset alignment mark of the pattern in the active layer 70 so as to detect an offset of the pattern in the active layer 70 with respect to the base substrate 10.

Those skilled in the art should understand that although the example of FIG. 3 shows that the fifth connection portion 55 overlaps the first electrode 20 (in other words, the orthographic projection of the fifth connection portion 55 on the base substrate 10 overlaps the orthographic projection of the first electrode 20 on the base substrate 10), the embodiments of the present disclosure are not limited to this. The fifth connection portion 55 may also be provided in other positions. For example, the fifth connection portion 55 may also be arranged to overlap the gate line 30 (in other words, the orthographic projection of the fifth connection portion 55 on the base substrate 10 at least partially overlaps the orthographic projection of the gate line 30 on the base substrate 10).

Similarly, although the example of FIG. 2B shows that the eighth connection portion 58 overlaps the first electrode 20 (in other words, the orthographic projection of the eighth connection portion 58 on the base substrate 10 overlaps the orthographic projection of the first electrode 20 on the base substrate 10), the embodiments of the present disclosure are not limited to this. The eighth connection portion 58 may also be provided in other positions. For example, the eighth connection portion 58 may also be arranged to overlap the gate line 30 (in other words, the orthographic projection of the eighth connection portion 58 on the base substrate 10 at least partially overlaps the orthographic projection of the gate line 30 on the base substrate 10).

A difference between the second sub-pixel unit PX2 and the first sub-pixel unit PX1 mainly lies in that the overlap alignment mark of the pattern in the source and drain layer 60 and the pattern in the gate line 30 in the first sub-pixel unit PX1 is replaced with the overlap alignment mark of the pattern in the active layer 70 and the pattern in the gate line 30 in the second sub-pixel unit PX2. Other structures of the second sub-pixel unit PX2 may be set to be the same or similar to those of the first sub-pixel unit PX1, and the specific content will not be repeated here.

By arranging the overlap alignment mark of the pattern in the source and drain layer 60 and the pattern in the gate line 30 and the overlap alignment mark of the pattern in the active layer 70 and the pattern in the gate line 30 respectively in different sub-pixels, it may avoid arranging too many alignment marks (or connecting portions) in a single sub-pixel unit, and more evenly distribute the alignment marks in the sub-pixel units. This may prevent an opening ratio of the sub-pixel unit from being significantly reduced due to the arrangement of the alignment mark, and is also conducive to a uniformity of a display light intensity of the display panel.

In some embodiments, the seventh connection portion 57 and the eighth connection portion 58 are rectangles with a common geometric center. In this way, the pattern of the active layer 70 and the pattern of the gate line 20 may be aligned with each other by overlapping the centers of the two connection portions. However, the specific forms of the seventh connection portion 57 and the eighth connection portion 58 are not limited to this. For example, they may be designed in various desired shapes such as a circle or a hexagon.

Figure 5:
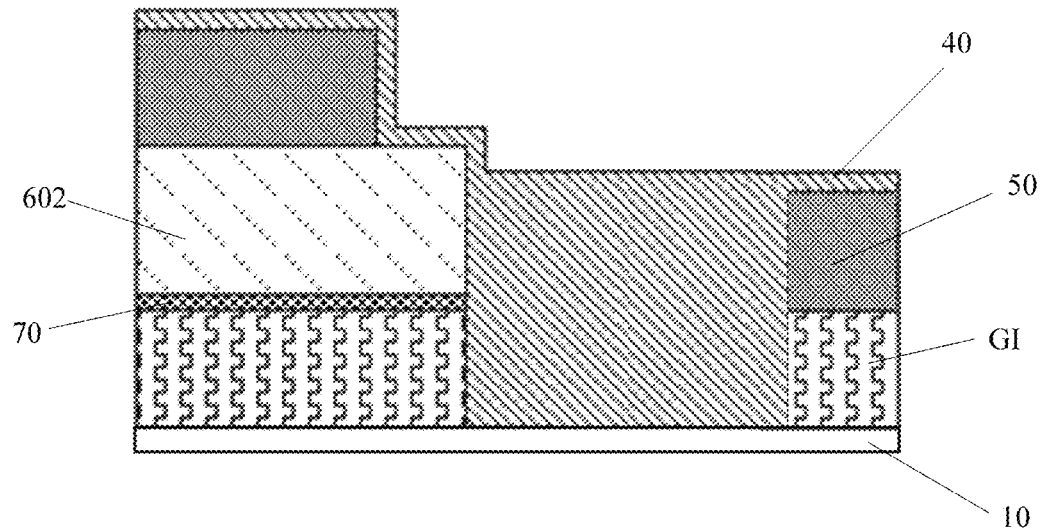
FIG. 5 schematically shows a schematic diagram taken along section line B-B' in FIG. 2A.
Figure 6:
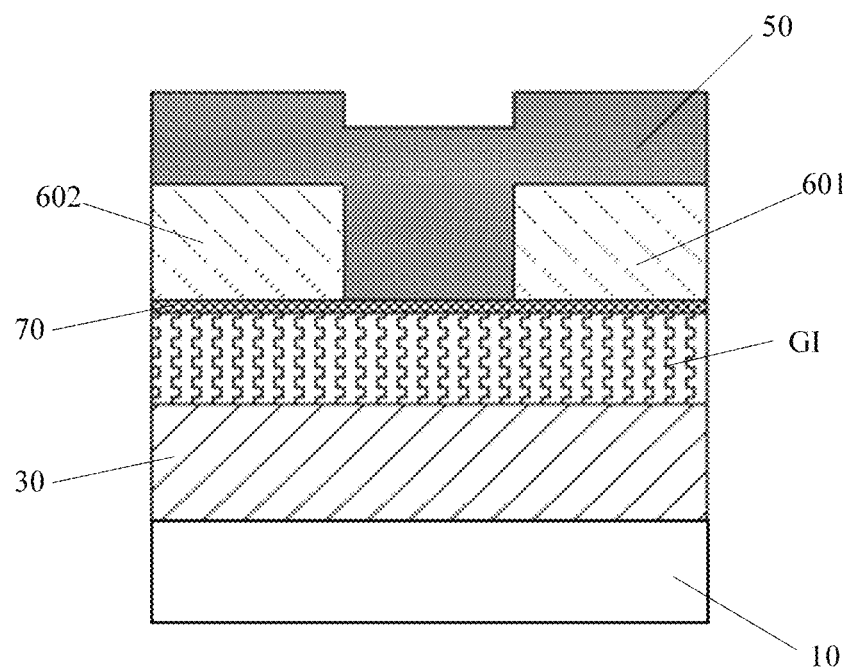
FIG. 6 schematically shows a schematic diagram taken along section line C-C' in FIG. 2A.
Figure 7:
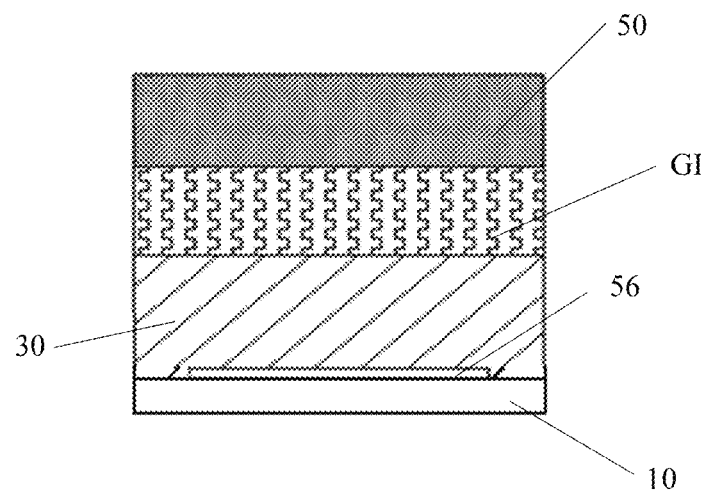
FIG. 7 schematically shows a schematic diagram taken along section line D-D' in FIG. 2A.
Figure 8:
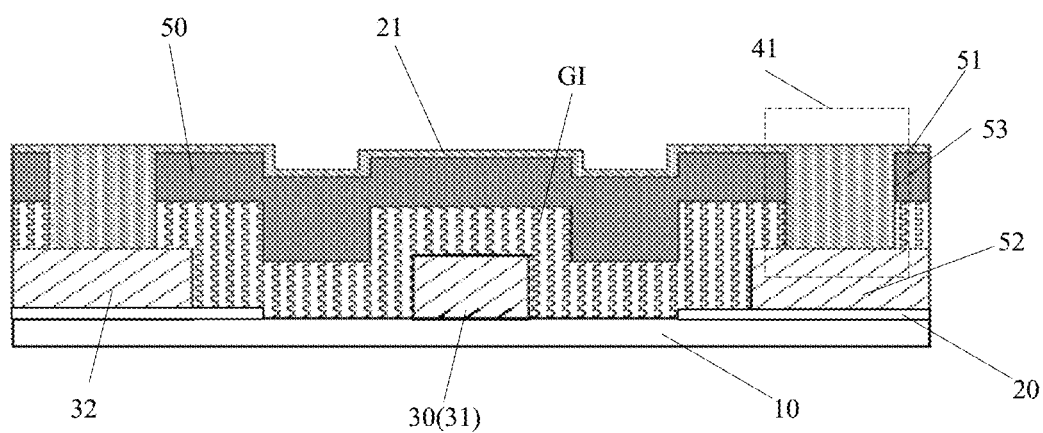
FIG. 8 schematically shows a schematic diagram taken along section line E-E' in FIG. 2A.

As shown in FIG. 4 to FIG. 9, a gate insulating layer GI may be further provided on the array substrate, and the gate insulating layer GI is located between the active layer (a semiconductor layer) 70 and the gate line 30. FIG. 6 shows a schematic structure of a transistor in the sub-pixel unit PX1, in which a source electrode 601 and a drain electrode 602 are arranged in the source and drain layer 60. The active layer 70 is arranged on a side of the source electrode 601 and the drain electrode 602 facing the base substrate 10 and on the side of the gate line 30 away from the base substrate 10. The gate insulating layer GI is further provided between the active layer 70 and the gate line 30. FIG. 5 shows an electrical connection between the drain electrode 602 of the transistor and the second electrode (pixel electrode) 40. In the embodiment described above, the source electrode 601 and the drain electrode 602 are interchangeable.

As an example, when the display panel has a large size, a relative offset between the array substrate and an opposite substrate (such as a color filter substrate) is large. In order to avoid a light leakage of the display panel, a black matrix area covering an edge of the sub-pixel is wide accordingly. Therefore, in the embodiments of the present disclosure, placing the connection portion in the sub-pixel unit may have less influence on the opening ratio of the sub-pixel unit.

In addition, when red (R), green (G) and blue (B) sub-pixels are used in the display panel, human eyes are generally the least sensitive to the blue sub-pixel. Therefore, arranging the connection portion in the blue sub-pixel has the least influence on the display effect. In some embodiments, both the first sub-pixel unit PX1 and the second sub-pixel PX2 may be blue sub-pixels.

Figure 12:
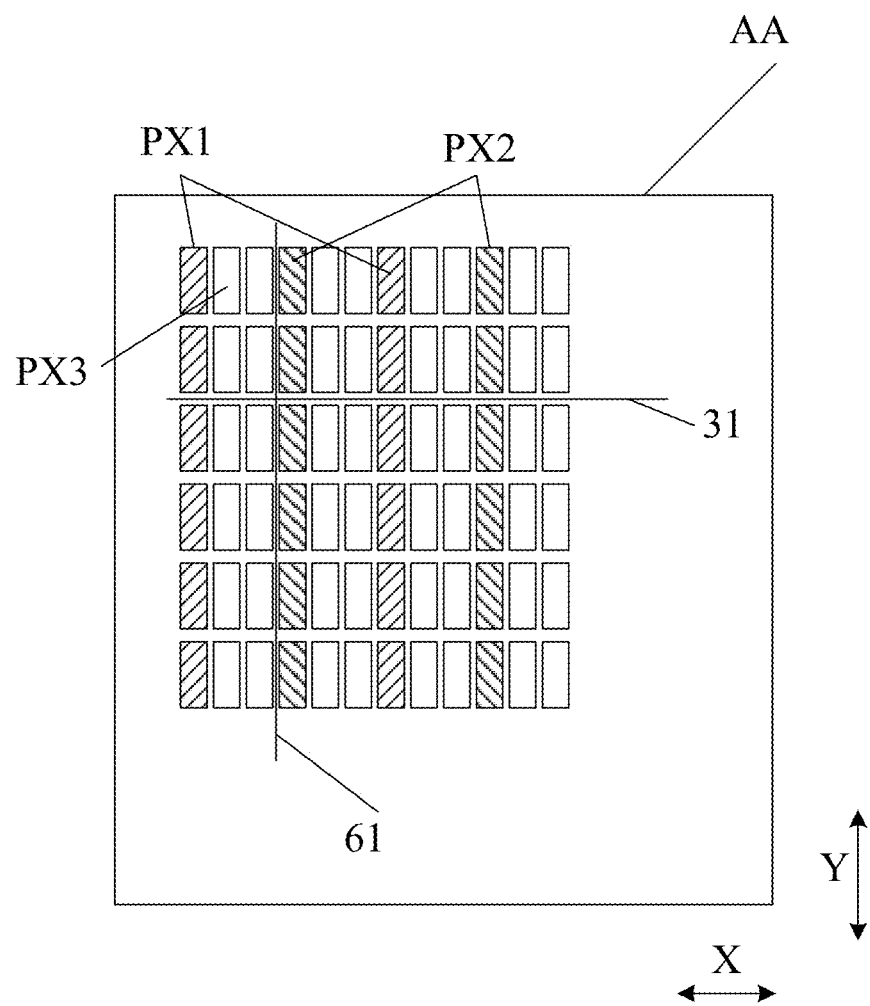
FIG. 12 schematically shows an exemplary distribution of the first sub-pixel unit and the second sub-pixel unit on the array substrate.

As an example, a plurality of first sub-pixel units PX1 and a plurality of second sub-pixels PX2 may be arranged on the array substrate. The plurality of first sub-pixel units PX1 and the plurality of second sub-pixel units PX2 may be alternately distributed on the array substrate. FIG. 12 schematically shows an exemplary embodiment in which the plurality of the first sub-pixel units PX1 and the plurality of second sub-pixels PX2 are distributed on the array substrate. The display area AA is shown in FIG. 12. A plurality of sub-pixel units, which may include the plurality of first sub-pixel units PX1 and the plurality of second sub-pixel units PX2 described above, may be arranged in the display area AA. As described above, in some embodiments, the overlapping alignment mark of the pattern in the source and drain layer 60 and the pattern in the gate line 30 is arranged in the first sub-pixel unit PX1, and the overlap alignment mark of the pattern in the active layer 70 and the pattern in the gate line 30 is arranged in the second sub-pixel unit PX2. The plurality of first sub-pixel units PX1 and the plurality of second sub-pixel units PX2 may be arranged to be alternately distributed in a certain direction, which is beneficial to both the alignment of the pattern in the source and drain layer 60 and the pattern in the gate line 30 and the alignment of the pattern in the active layer 70 and the pattern in the gate line 30. In the example shown in FIG. 12, the first sub-pixel units PX1 (represented by left slashes) and the second sub-pixel units PX2 (represented by right slashes) are both arranged in columns. Each column of first sub-pixel units PX1 and each column of second sub-pixel units PX2 are alternately arranged in the x-direction. The y-direction may be, for example, a direction in which the data line 61 extends, and the x-direction is a direction intersecting the y-direction (for example, a direction in which the gate line 31 extends). Each column of first sub-pixel units PX1 and each column of second sub-pixel units PX2 may also be separated by other sub-pixel unit PX3. The other sub-pixel unit PX3 may be a sub-pixel unit (for example, a conventional sub-pixel unit) including neither the overlapping alignment mark of the pattern in the source and drain layer 60 and the pattern in the gate line 30 nor the overlapping alignment mark of the pattern in the active layer 70 and the pattern in the gate line 30. As for the specific structure example of the first sub-pixel unit PX1 and the second sub-pixel unit PX2, reference may be made to FIG. 2A and FIG. 2B. It should be noted that the embodiments of the present disclosure are not limited to this. For example, the first sub-pixel unit PX1 and the second sub-pixel unit PX2 may not be arranged in columns, or adjacent first sub-pixel unit PX1 and second sub-pixel unit PX2 may not be separated by other sub-pixel unit PX3.

In the embodiments of the present disclosure, the first connection portion 51 may be located on a side of the fourth connection portion 54 or the seventh connection portion 57 away from the data line 61 connected to the sub-pixel unit where the first connection portion 51 is located.

It should be noted that the "arranged in the same layer" in the present disclosure refers to the structure in the same film layer formed by the same material through the same patterning step. Generally, the structure arranged in the same layer may be exposed by using the same mask in the patterning process. Considering a case that a complete display area is formed by splicing a plurality of exposure patterns, an operation of splicing the plurality of exposure patterns needs to be performed for each layer of the structure arranged in the same layer.

Figure 10:
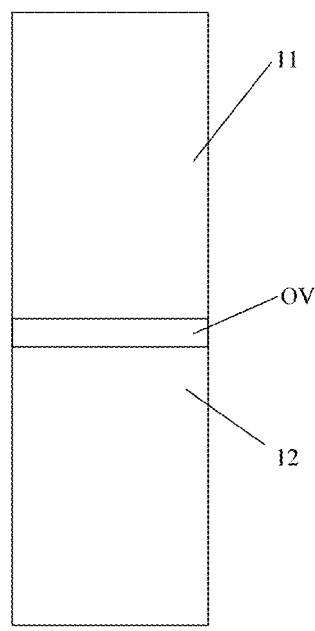
FIG. 10 schematically shows a repeated exposure area where exposure patterns are spliced.

In another aspect, in a case of splicing the plurality of exposure patterns into the complete display area of the display panel, there may be a misalignment between adjacent exposure patterns, which may cause short circuit or open circuit of a signal line (such as the data line). To this end, a repeated exposure area may be provided between adjacent exposure patterns. For example, as shown in FIG. 10, an overlapping area OV is provided between an exposure pattern 11 and an exposure pattern 12. In the overlapping area OV, both the exposure pattern 11 and the exposure pattern 12 are exposed. Accordingly, a pattern falling into the overlapping area OV may be exposed twice. Therefore, the overlapping area OV may be called the repeated exposure area. Since the pattern in the repeated exposure area may be exposed twice, the pattern in the repeated exposure area may have a reduced line width with respect to a pattern exposed once. Therefore, in the embodiments of the present disclosure, a widening design is made for the pattern in the repeated exposure area.

Figure 11:
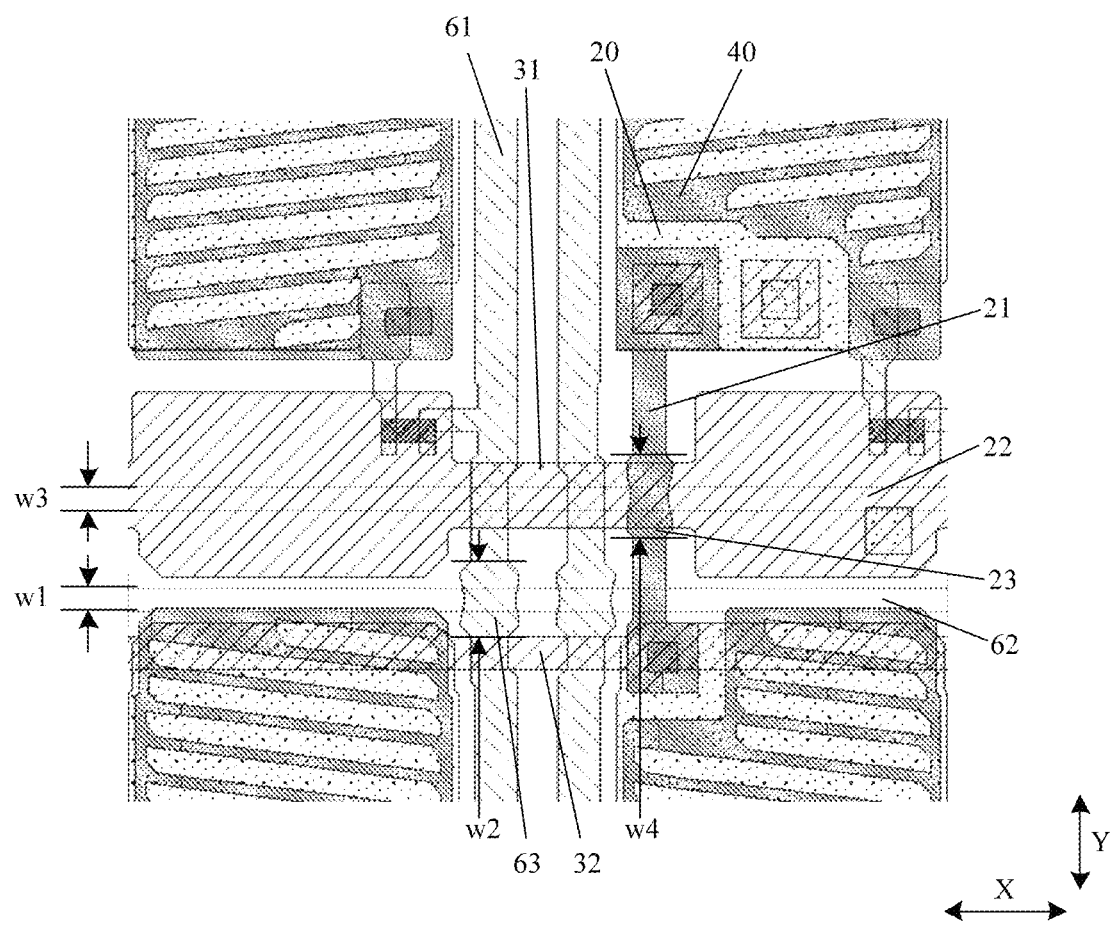
FIG. 11 schematically shows a design of a repeated exposure area of the array substrate according to some embodiments of the present disclosure.

An example of such a design is shown in FIG. 11. FIG. 11 shows a partial plan view of the array substrate. The array substrate may include the base substrate 10, the first electrode 20, the gate line 30, the second electrode 40 and the source and drain layer 60 as described above. The array substrate is further provided with a data line 61 arranged in the same layer as the source and drain layer 60. The data line 61 extends in the first direction (for example, the Y-direction in FIG. 11). As described above, in the case of splicing exposure, the data line 61 needs to be formed by at least two exposures. A source and drain layer repeated exposure area 62 is shown in FIG. 11. A part of the data line 61 that falls into the source and drain layer repeated exposure area 62 may be exposed twice. To this end, the data line 61 is provided with a data line widening portion 63 having a width greater than that of a part of the data line adjacent to the data line widening portion 63. The source and drain layer repeated exposure area 62 may pass through the data line widening portion 63. In order to ensure that the data line widening portion 63 may cover the part of the data line 61 that falls into the source and drain layer repeated exposure area 62, a width w2 of the data line widening portion 63 in the first direction is greater than a width w1 of the source and drain layer repeated exposure area 62 in the first direction. This may prevent the part of the data line 61 falling into the source and drain layer repeated exposure region 62 from having a too small width and being easy to be broken due to multiple exposures. As an example, the width w1 of the source and drain layer repeated exposure region 62 in the first direction may range from 3 µm to 20 µm, or range from 3 µm to 10 µm, for example, may be about 5 µm. The width w2 of the data line widening portion 63 in the first direction may range from 8 µm to 15 µm, for example, may be 11.5 µm.

In some embodiments, as shown in FIG. 11, an orthographic projection of an edge of the data line widening portion 63 on the base substrate 10 has a concave shape toward a center of the data line 61. This is because the part of the data line widening portion 63 that falls into the source and drain layer repeated exposure region 62, due to being exposed twice, is narrower than the portion exposed once.

In some embodiments, as shown in FIG. 11, the array substrate may further include a gate portion 31 in the gate line 30 and a first electrode bridge line 32 arranged in the same layer as the gate line 30. The first electrode bridge line 32 and the gate portion 31 extend in the second direction. The second direction (for example, the X-direction in FIG. 11) may intersect the first direction. For example, the second direction is perpendicular to the first direction. The first electrode bridge line 32 is used to electrically connect the first electrodes 20 in adjacent sub-pixel units in the second direction. An orthographic projection of the data line widening portion 63 on the base substrate 10 is located between the orthographic projection of the gate line 30 on the base substrate 10 and the orthographic projection of the first electrode bridge line 32 on the base substrate 10. As clearly shown in FIG. 11, the orthographic projection of the data line widening portion 63 on the base substrate 10 does not overlap the orthographic projection of the gate line 30 on the base substrate 10 and the orthographic projection of the first electrode bridge line 32 on the base substrate 10. On the one hand, it may prevent the data line widening portion 63 from overlapping structures in other metal layers (such as the gate line 30, the first electrode bridge line 32, etc.) and thus resulting in an increase in parasitic resistance, and may further avoid as much as possible a change in an overall structure of the sub-pixel unit caused by a part of the data line 61 related to the source and drain layer repeated exposure area 62, so that the sub-pixel unit may maintain a good opening ratio.

A similar design may also be adopted in other film layers of the array substrate. For example, the first electrode transfer line 21 arranged in the same layer as the second electrode 40 may be provided on the array substrate. The first electrode transfer line 21 extends in the first direction and is used to electrically connect the first electrodes 20 in adjacent sub-pixel units in the first direction. Similar to the data line 61, in the case of splicing exposure, the first electrode transfer line 21 also needs to be formed by at least two exposures. A second electrode repeated exposure area 22 is shown in FIG. 11. A part of the first electrode transfer line 21 that falls into the second electrode repeated exposure area 22 may be exposed twice. To this end, the first electrode transfer line 21 is provided with a transfer line widening portion 23 having a width greater than that of a part of the first electrode transfer line 21 adjacent to the transfer line widening portion 23. The second electrode repeated exposure area 22 may pass through the transfer line widening portion 23. In order to ensure that the transfer line widening portion 23 may cover the part of the first electrode transfer line 21 that falls into the second electrode repeated exposure area 22, a width w4 of the transfer line widening portion 23 in the first direction is greater than a width w3 of the second electrode repeated exposure area 22 in the first direction. This may prevent the part of the first electrode transfer line 21 that falls into the second electrode repeated exposure area 22 from having a too small width and being easy to be broken due to multiple exposures. As an example, the width w3 of the second electrode repeated exposure area 22 in the first direction may range from 3 µm to 20 µm, or range from 3 µm to 10 µm, for example, may be about 5 µm. The width w4 of the transfer line widening portion 23 in the first direction may range from 10 µm to 20 µm, for example, may be 14 µm.

Similar to the data line widening portion 63, an edge of the transfer line widening portion 23 may also have a concave shape toward a center of the first electrode transfer line 21.

In the embodiments described above, splicing the adjacent exposure patterns in the first direction is illustrated by way of example. It should be understood that the embodiments of the present disclosure are not limited to this. If necessary, a similar design may also be used in other directions (for example, the second direction) to reduce an effect of the repeated exposure at the splicing position.

Figure 13:
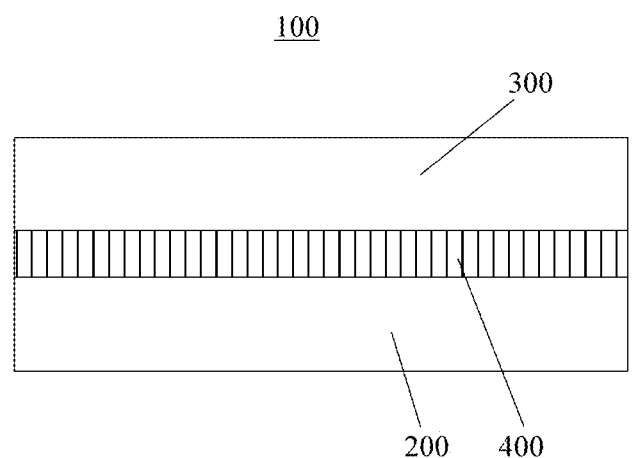
FIG. 13 schematically shows a display panel according to some embodiments of the present disclosure.

The embodiments of the present disclosure further provide a display panel 100. As shown in FIG. 13, the display panel 100 may include: the array substrate 200 according to any one of the embodiments described above; an opposite substrate 300 (such as a color filter substrate) located on a side of the array substrate 200 away from the base substrate 10; and a liquid crystal layer 400 located between the array substrate 200 and the opposite substrate 300.

The embodiments of the present disclosure further provide an electronic device, including the array substrate 200 according to any one of the embodiments described above or the display panel 100 described above. As an example, the electronic device may be any product or component with a display function, such as a television, a monitor, a digital photo frame, a mobile phone, a smart watch, and a tablet computer.

It should be understood by those skilled in the art that the features in the embodiments described above of the present disclosure may be combined with each other unless there is a contradiction. Although an ultra-large-size display panel is used as an example in the embodiments described above, the embodiments of the present disclosure are not limited to an ultra-large-size display panel, and may also be used for medium-size and small-size display panels, for example.

Although the present disclosure has been described with reference to the drawings, the embodiments disclosed in the drawings are intended to exemplify the embodiments of the present disclosure, and should not be understood as a limitation of the present disclosure. Size ratios in the drawings are only schematic and should not be construed as limiting the present disclosure.

The embodiments described above merely illustrate the principle and structure of the present disclosure, but are not used to limit the present disclosure. Those skilled in the art should understand that any changes and improvements made to the present disclosure without departing from the general idea of the present disclosure fall within the scope of the present disclosure. The protection scope of the present disclosure shall be determined by the scope defined by the claims of the present disclosure.

What is claimed is:

1. An array substrate, comprising:
   a base substrate;
   at least one first electrode arranged on the base substrate;
   a gate line arranged on the base substrate, wherein the gate line is electrically insulated from the first electrode; and
   at least one second electrode arranged on a side of the gate line away from the base substrate,
   wherein at least one sub-pixel unit is provided on the base substrate, and the at least one sub-pixel unit comprises at least one first sub-pixel unit,
   wherein the at least one first sub-pixel unit comprises:
      a first connection portion arranged in a same layer as the second electrode and a second connection portion arranged in a same layer as the gate line, the second connection portion being electrically connected to the first electrode, and an orthographic projection of the second connection portion on the base substrate at least partially overlapping an orthographic projection of the first connection portion on the base substrate; and
      a sixth connection portion arranged in a same layer as the first electrode, an orthographic projection of the sixth connection portion on the base substrate falling within an orthographic projection of the gate line on the base substrate,
   wherein the array substrate further comprises:
      a source and drain layer located on the side of the gate line away from the base substrate and located on a side of the second electrode facing the base substrate; and
      a data line arranged in a same layer as the source and drain layer, wherein the data line extends in a first direction;
      wherein the data line is provided with a data line widening portion having a width greater than a width of a part of the data line adjacent to the data line widening portion, and
   wherein the array substrate further comprises a gate portion in the gate line and a first electrode bridge line arranged in the same layer as the gate line, wherein the first electrode bridge line and the gate line extend in a second direction intersecting the first direction, the first electrode bridge line is configured to electrically connect first electrodes in adjacent sub-pixels in the second direction, and an orthographic projection of the data line widening portion on the base substrate is located between the orthographic projection of the gate line on the base substrate and an orthographic projection of the first electrode bridge line on the base substrate.

2. The array substrate of claim 1, wherein the first connection portion and the second connection portion are located on a side of the first electrode away from the base substrate.

3. The array substrate of claim 1, wherein the first connection portion is electrically connected to the second connection portion through a via hole.

4. The array substrate of claim 3, further comprising:
   an insulating layer located between the gate line and the second electrode, wherein the first sub-pixel unit further comprises a third connection portion formed as an opening of the via hole in the insulating layer between the gate line and the second electrode.

5. The array substrate of claim 4, wherein an orthographic projection of the third connection portion on the base substrate at least partially overlaps the orthographic projection of the first connection portion on the base substrate.

6. The array substrate of claim 1, wherein the orthographic projection of the second connection portion on the base substrate at least partially overlaps an orthographic projection of the first electrode on the base substrate; and
   wherein the second connection portion has a first edge and a second edge, the first electrode has a third edge and a fourth edge located in the first sub-pixel unit, the first edge and the third edge are parallel to each other, and the second edge and the fourth edge are parallel to each other.

7. The array substrate of claim 1, wherein the first sub-pixel unit further comprises a fourth connection portion arranged in the same layer as the gate line and a fifth connection portion arranged in the same layer as the source and drain layer; and
   wherein an orthographic projection of the fifth connection portion on the base substrate at least partially overlaps an orthographic projection of the fourth connection portion on the base substrate.

8. The array substrate of claim 7, wherein each of the orthographic projection of the fifth connection portion on the base substrate and the orthographic projection of the fourth connection portion on the base substrate does not overlap the orthographic projection of the first connection portion on the base substrate and the orthographic projection of the second connection portion on the base substrate.

9. The array substrate claim 1, further comprising an active layer located on a side of the gate line away from the base substrate and located on a side of the second electrode facing the base substrate, wherein the at least one sub-pixel unit further comprises at least one second sub-pixel unit, the at least one second sub-pixel unit comprises a seventh connection portion arranged in the same layer as the gate line and an eighth connection portion arranged in a same layer as the active layer, and an orthographic projection of the seventh connection portion on the base substrate at least partially overlaps an orthographic projection of the eighth connection portion on the base substrate.

10. The array substrate of claim 9, wherein the first sub-pixel unit and the second sub-pixel unit are blue sub-pixel units.

11. The array substrate of claim 9, wherein:
    a plurality of first sub-pixel units and a plurality of second sub-pixel units are provided on the base substrate and are alternately distributed on the array substrate in the second direction intersecting the first direction.

12. The array substrate of claim 1, wherein an orthographic projection of an edge of the data line widening portion on the base substrate has a concave shape toward a center of the data line.

13. The array substrate of claim 1, further comprising: a first electrode transfer line arranged in the same layer as the second electrode, wherein the first electrode transfer line extends in the first direction and is configured to electrically connect the first electrodes in adjacent sub-pixel units in the first direction, and the first electrode transfer line is provided with a transfer line widening portion having a width greater than a width of a part of the first electrode transfer line adjacent to the transfer line widening portion; and wherein an orthographic projection of an edge of the transfer line widening portion on the base substrate has a concave shape toward a center of the first electrode transfer line.

14. The array substrate of claim 1, wherein the first electrode is a common electrode, and the second electrode is a pixel electrode.

15. A display panel, comprising:
the array substrate of claim 1;
an opposite substrate located on a side of the array substrate away from the base substrate; and
a liquid crystal layer located between the array substrate and the opposite substrate.

16. An electronic device, comprising:
the array substrate of claim 1.

\* \* \* \* \*